(12) United States Patent
Lin et al.

(10) Patent No.: US 10,651,114 B2
(45) Date of Patent: May 12, 2020

(54) APPARATUS AND METHOD OF THREE DIMENSIONAL CONDUCTIVE LINES

(71) Applicant: Taiwan Semiconductor Manufacturing Co., Ltd., Hsin-Chu (TW)

(72) Inventors: Chih-Yu Lin, Taichung (TW); Kao-Cheng Lin, Taipei (TW); Li-Wen Wang, Taichung (TW); Yen-Huei Chen, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/224,159

(22) Filed: Dec. 18, 2018

(65) Prior Publication Data
US 2019/0122960 A1 Apr. 25, 2019

Related U.S. Application Data

(60) Continuation of application No. 15/983,786, filed on May 18, 2018, now Pat. No. 10,163,759, which is a continuation of application No. 15/379,537, filed on Dec. 15, 2016, now Pat. No. 9,997,436, which is a division of application No. 14/077,252, filed on Nov. 12, 2013, now Pat. No. 9,524,920.

(51) Int. Cl.
*H01L 23/48* (2006.01)
*H01L 25/065* (2006.01)
*H01L 27/06* (2006.01)
*G11C 5/06* (2006.01)
*G11C 7/18* (2006.01)
*H01L 27/10* (2006.01)

(52) U.S. Cl.
CPC ............ *H01L 23/481* (2013.01); *G11C 5/063* (2013.01); *G11C 7/18* (2013.01); *H01L 25/0657* (2013.01); *H01L 27/0688* (2013.01); *H01L 27/10* (2013.01); *H01L 2225/06541* (2013.01); *H01L 2924/0002* (2013.01)

(58) Field of Classification Search
CPC . H01L 21/8221; H01L 21/84; H01L 27/0688; H01L 27/1203; H01L 27/11; H01L 25/0657; H01L 27/1104; H01L 27/108; H01L 27/10844; H01L 23/481; G11C 11/413; G11C 7/1075; G11C 7/1096; G11C 11/40; G11C 11/419; G11C 5/025; G11C 8/08; G11C 8/16; G11C 11/412
See application file for complete search history.

(56) References Cited

U.S. PATENT DOCUMENTS

| 5,835,396 A | 11/1998 | Zhang |
| 5,864,496 A | 1/1999 | Mueller et al. |
| 5,973,953 A | 10/1999 | Yamashita et al. |
| 6,504,255 B2 | 1/2003 | Keeth |

(Continued)

*Primary Examiner* — Ahmed N Sefer
(74) *Attorney, Agent, or Firm* — Duane Morris LLP

(57) ABSTRACT

An apparatus and method of three dimensional conductive lines comprising a first memory column segment in a first tier, a second memory column segment in a second tier, and conductive lines connecting the first memory column segment to the second memory column segment. In some embodiments a conductive line is disposed in the first tier on a first side of the memory column and in the second tier on a second side of the memory column.

20 Claims, 12 Drawing Sheets

(56) References Cited

U.S. PATENT DOCUMENTS

| | | |
|---|---|---|
| 6,657,880 B1 | 12/2003 | Callahan |
| 6,661,691 B2 | 12/2003 | Fricke et al. |
| 7,564,134 B2 | 7/2009 | Yang et al. |
| 8,223,525 B2 | 7/2012 | Balakrishnan |
| 8,467,258 B2 | 6/2013 | Lin et al. |
| 9,171,849 B2 | 10/2015 | Chan |
| 9,177,668 B2 | 11/2015 | Lin et al. |
| 9,202,557 B2 | 12/2015 | Wang |
| 9,625,186 B2 | 4/2017 | Chou et al. |
| 2003/0147266 A1 | 8/2003 | Vyvoda et al. |
| 2003/0185033 A1 | 10/2003 | Fricke et al. |
| 2011/0018064 A1 | 1/2011 | Doornbos |
| 2013/0021060 A1 | 1/2013 | Or-Bach |
| 2013/0258746 A1 | 10/2013 | Kurokawa |
| 2014/0269022 A1 | 9/2014 | Xie et al. |
| 2015/0063039 A1* | 3/2015 | Chen .................. G11C 29/04 365/189.02 |
| 2015/0063040 A1 | 3/2015 | Chan |
| 2015/0121030 A1 | 4/2015 | Lin |

\* cited by examiner

APPARATUS AND METHOD OF THREE DIMENSIONAL CONDUCTIVE LINES

CROSS REFERENCE TO RELATED APPLICATIONS

The present application is a continuation of U.S. patent application Ser. No. 15/983,786, filed on May 18, 2018, entitled "APPARATUS AND METHOD OF THREE DIMENSIONAL CONDUCTIVE LINES," which is a continuation of U.S. patent application Ser. No. 15/379,537, filed on Dec. 15, 2016, entitled "APPARATUS AND METHOD OF THREE DIMENSIONAL CONDUCTIVE LINES," which is a divisional of U.S. patent application Ser. No. 14/077,252 filed Nov. 12, 2013, entitled "APPARATUS AND METHOD OF THREE DIMENSIONAL CONDUCTIVE LINES" (now U.S. Pat. No. 9,524,920), each of which is the incorporated by reference herein in its entirety.

FIELD

Aspects of the present disclosure generally relate to semiconductor memories. More particularly, aspects of the present disclosure relate to a three dimensional conductive line in a semiconductor memory.

BACKGROUND

A recent trend in semiconductor memories is to fabricate three dimensional (3D) integrated circuits (3D IC). 3D ICs include a variety of structures, such as die on silicon interposer, stacked dies, multi-tiered, stacked CMOS structures, or the like. These 3D circuits offer a host of advantages over traditional two dimensional circuits: lower power consumption, higher memory cell density, greater efficiency, alleviating bottlenecks, shorter critical path delays, and lower area cost to name just a few. Stacked die 3D IC are constructed by vertically stacking two dimensional chips and providing power and signal communication connections between the chips (for example, using through-substrate vias, TSV). Alternatively, 3D IC can be constructed using a single die with integrated components arranged in three dimensions into a plurality of tiers. Each tier can have its own active device layer and/or interconnect structure. Each pair of adjacent tiers are separated from each other by an insulating layer or thin semiconductor substrate or layer. Unfortunately, the performance of these 3D IC is limited by the performance variation of the worst-performing chip or tier in the vertical stack.

BRIEF DESCRIPTION OF THE DRAWINGS

The following will be apparent from elements of the figures, which are provided for illustrative purposes and are not necessarily to scale.

DETAILED DESCRIPTION

Figure 1:
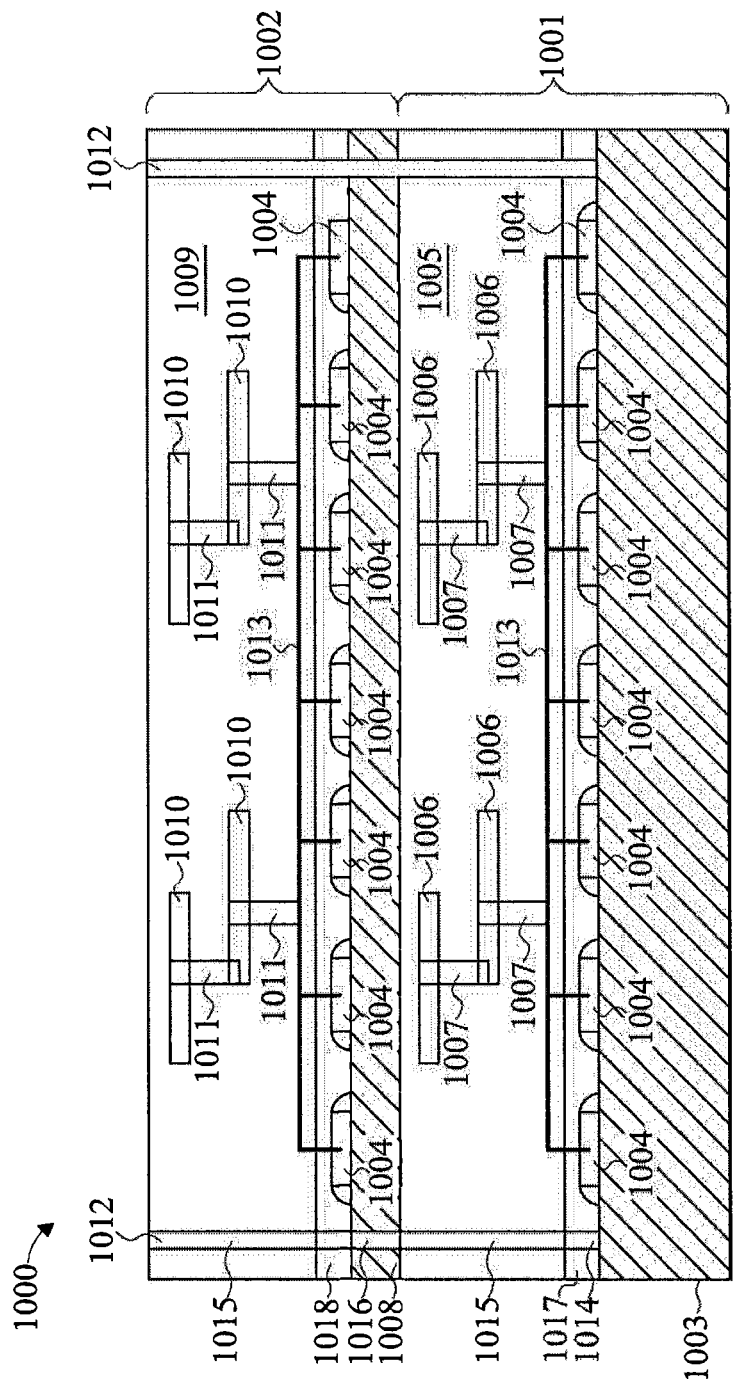
FIG. 1 is a simplified cross sectional view of a 3D IC structure in accordance with some embodiments of the present disclosure.

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Static random access memory (SRAM) is a type of semiconductor memory that uses bi-stable circuitry to form a memory cell. Dynamic random access memory (DRAM) is another type of semiconductor memory in which each memory bit cell includes a capacitor and a transistor. Each memory cell stores a single bit and is connected to two types of conductive lines: bit lines (BL) and word lines (WL). When reading a selected memory cell, a pre-charge voltage is applied and the bit value is transferred from the memory cell to the bit lines creating a small voltage difference across the bit lines. A sense amplifier measures this small voltage difference across the bit lines and translates it to a full logic signal that may be used in digital logic.

SRAM and DRAM circuits are formed on a semiconductor substrate and referred to as a memory chip. These memory chips can be used to form three dimensional (3D) memory circuits by vertically stacking the chips and providing power and signal communication connections between the chips using TSVs. Each chip is called a tier of the 3D memory circuit. Alternatively, 3D memory circuits can be constructed using a single semiconductor wafer, with integrated components arranged in three dimensions. In a single-substrate 3D IC (such as a stacked CMOS 3D IC), components are also arranged into tiers, each tier having a plurality of layers. Each tier has a respective interconnect structure, and optionally has a respective active device layer. A respective insulating layer or semiconductor layer is provided between each successive pair of adjacent tiers. If the second or subsequent tier of the 3D IC has an active device layer, a semiconductor layer is provided at the bottom of that tier. For example, in some embodiments, a thin semiconductor substrate is bonded over the top interconnect layer (e.g., top metal line layer) of the adjacent underlying tier. In some embodiments, the stacked CMOS 3D IC has two tiers. The first tier includes the semiconductor substrate with active devices thereon, and an interconnect structure including conductive line layers and conductive via layers. A thin semiconductor substrate can be directly bonded over the top conductive line layer of the first tier. Active devices (e.g., transistors, diodes MOS capacitors and varactors) are formed in thin semiconductor substrate of the second tier. A second tier interconnect structure is formed over the thin semiconductor substrate of the second tier. The second tier interconnect structure includes second tier conductive line layers and second tier conductive via layers.

During the fabrication of memory chips, variation in transistor, capacitor, and resistor attributes—due to process variations—results in output performance variance which degrades the overall chip performance. This variance is a particular challenge in 3D memory circuits because the 3D memory circuit's output performance is limited by the worst—or least—performing tier or die. Since each layer or component is fabricated separately, the impact of process variation can be magnified in 3D memory circuits.

The present disclosure provides a 3D conductive line layout for 3D memory circuits. Specifically, the present disclosure provides a 3D bit line layout and a 3D word line layout for 3D memory circuits. In some embodiments, an inter-tier memory column comprises: a first memory cell segment and second memory cell segment, each segment disposed within a different tier and each bit line of the segments changing from a first side of the column to a second side of the column. In some embodiments, a 3D bit line layout comprises a first segment in a first tier, a second segment in a second tier, the first and second segments connected by a vertical (i.e., out of plane) bit line. In some embodiments, a 3D word line layout comprises a first segment in a first tier, a second segment in a second tier, the first and second segments connected by a vertical (i.e., out of plane) word line.

Figure 2A:
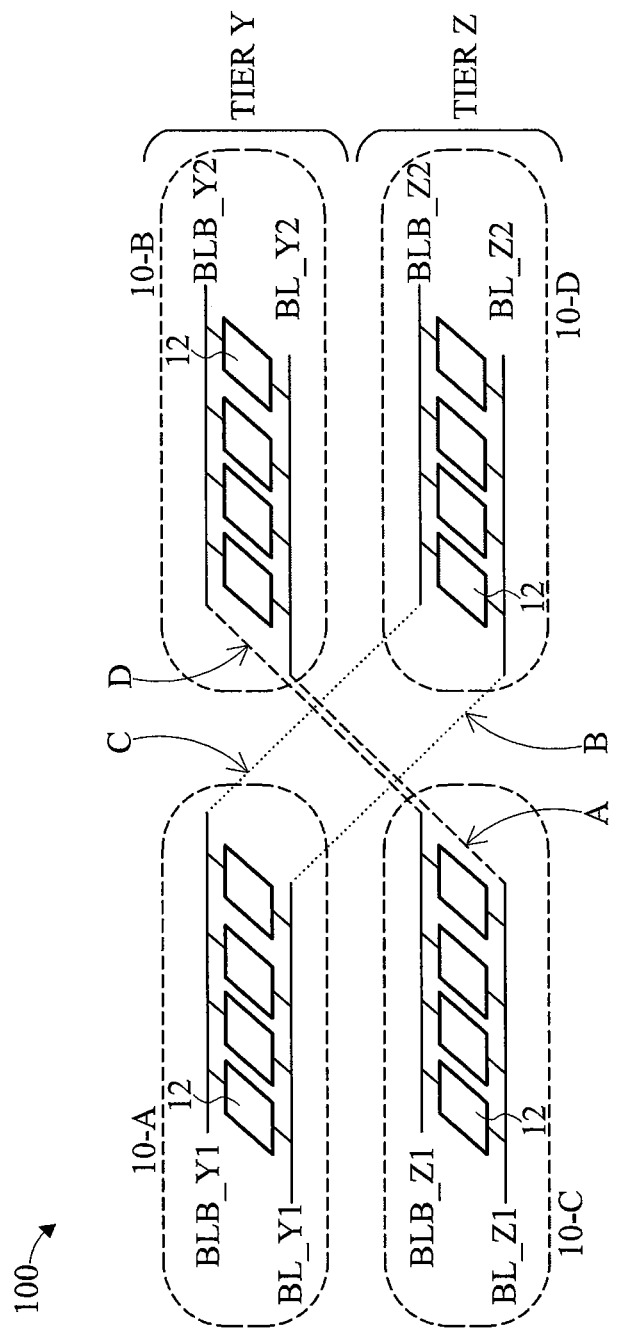
FIG. 2A is a schematic view of a 3D bit line layout in accordance with some embodiments of the present disclosure.

Although FIG. 2A schematically shows the vertical bit lines as diagonal lines A, B, C, D, each vertical bit line includes a combination of one or more out of plane (via) portions, and in some embodiments can include one or more in plane (line portions). In embodiments having a stacked CMOS structure, the vertical (out of plane) bit lines A, B, C and D can include a combination of local vias and/or inter-tier vias, and in some embodiments further include conductive lines connected to the local vias and/or inter-tier vias. In embodiments having a stacked die structure, the vertical bit lines can include a combination of local vias and/or TSVs, and in some embodiments further include conductive lines connected to the local vias and/or TSVs.

A method of forming an inter-tier memory column is further disclosed, comprising forming a first segment in a first tier, forming a second segment in a second tier, and connecting a conductive line of the first segment to a conductive line of the second segment.

FIG. 1 is a simplified cross sectional view of a 3D IC structure 1000, specifically a stacked CMOS 3D IC with two tiers in accordance with some embodiments. The first tier 1001 includes a first semiconductor substrate 1003 with a plurality of active devices 1004 (e.g., transistors, diodes, MOS capacitors, and/or varactors) disposed within active device layer 1017, and a first tier interconnect structure layer 1005 including first tier conductive line layers 1006 and first tier conductive vias 1007. A thin second semiconductor substrate 1008 can be directly bonded over the top conductive line layer 1006 of the first tier 1001. Second tier 1002 comprises second semiconductor substrate 1008, and a plurality of active devices 1004 disposed within active device layer 1018 formed on second semiconductor substrate 1008. A second tier interconnect structure layer 1009 is formed over the second semiconductor substrate 1008 of the second tier 1002. The second tier interconnect structure 1009 includes second tier conductive line layers 1010 and second tier conductive vias 1011. Inter-tier vias 1012 connect first tier 1001 and second tier 1002. In some embodiments, inter-tier vias 1012 comprise a contact portion 1014, local via portion 1015, and inter-tier via portion 1016. First tier interconnect structure 1005 and second tier interconnect structure 1009 additionally include bit lines 1013 or similar metal line connectors. Although only two tiers are shown in FIG. 1, it will be understood that a 3D IC structure can include more than two tiers.

FIG. 2A is schematic view of a 3D bit line layout 100 in accordance with some embodiments of the present disclosure. FIG. 2A presents four segments 10 of memory cell columns: a first segment 10-A, a second segment 10-B, a third segment 10-C, and a fourth segment 10-D. The four segments 10 are arranged into two tiers—Tier Y and Tier Z—of a 3D IC. In some embodiments, the cells 12 of the 3D bit line layout 100 are located in the first and second tier (or die) of the 3D IC. In other embodiments, the 3D IC has more than two tiers or dies, and the cells 12 of the 3D bit line layout 100 are located in any two tiers (or dies) of the 3D IC. First segment 10-A and second segment 10-B are disposed within Tier Y, and third segment 10-C and fourth segment 10-D are disposed within Tier Z. First segment 10-A is disposed vertically above third segment 10-C. Second segment 10-B is disposed vertically above fourth segment 10-D.

First segment 10-A comprises a first bit line designated BL-Y1 and second bit line designated BLB-Y1. The designator "BL" is "bit line" and the designator "BLB" is "bit line bar." The designator "Y1" indicates that these bit lines are the first segment of Tier Y. A plurality of cells 12 are disposed between and connected to first bit line BL-Y1 and second bit line BLB-Y1.

Second segment 10-B comprises a first bit line designated BL-Y2 and second bit line designated BLB-Y2. The designator "Y2" indicates that these bit lines are the second segment of Tier Y. A plurality of cells 12 are disposed between and connected to first bit line BL-Y2 and second bit line BLB-Y2.

Third segment 10-C comprises a first bit line designated BL-Z1 and second bit line designated BLB-Z1. The designator "Z1" indicates that these bit lines are the first segment of Tier Z. A plurality of cells 12 are disposed between and connected to first bit line BL-Z1 and second bit line BLB-Z1.

Fourth segment 10-D comprises a first bit line designated BL-Z2 and second bit line designated BLB-Z2. The designator "Z2" indicated that these bit lines are the second segment of Tier Z. A plurality of cells 12 are disposed between and connected to first bit line BL-Z2 and second bit line BLB-Z2.

In some embodiments, segments 10-A to 10-D are further arranged such that, in addition to segments 10-A to 10-D disposed vertically above or below each other, first bit lines BL-Y1, BL-Y2, BL-Z1, and BL-Z2, are disposed within a first vertical plane while second bit lines BLB-Y1, BLB-Y2, BLB-Z1, and BLB-Z2, are disposed in a second vertical plane.

Segments 10-A to 10-D are connected between dies or tiers by vertical bit lines or vias. In the case of a single-chip stacked CMOS 3D IC, the connections between tiers include "inter-tier vias," 1016 which extend completely through the insulating layer or semiconductor layer 1008 of one of the upper tiers 1002. In the case of a stacked die 3D IC, the connections between dies include TSVs. First segment 10-A is connected to fourth segment 10-D by vertical bit lines B and C. Vertical bit line B connects first bit line BL-Y1 with first bit line BL-Z2. Vertical bit line C connects second bit line BLB-Y1 with second bit line BLB-Z2. Second segment 10-B is connected to third segment 10-C by vertical bit lines A and D. Vertical bit line A connects first bit line BL-Z1 with first bit line BLY2. Vertical bit line D connects second bit line BLB-Z1 with second bit line BLB-Y2.

As a result of the connections made by vertical bit lines A, B, C, and D, the four disclosed segments 10-A to 10-D form two inter-tier memory cell columns. First segment 10-A and fourth segment 10-D form a first inter-tier memory cell column. Second segment 10-B and third segment 10-C form a second inter-tier memory cell column.

Although each segment 10-A to 10-D shown in FIG. 2A has an equal number of cells 12, in some embodiments at least one segment 10 has a different number of cells 12 from at least one other segment 10.

In some embodiments, vertically stacked segments 10 are substantially aligned such that, for example, first bit line BL-Y1 is vertically above first bit line BL-Z1, or, for example, the plurality of cells 12 in first segment 10-A are aligned vertically above the plurality of cells 12 in third segment 10-C.

Figure 2B:
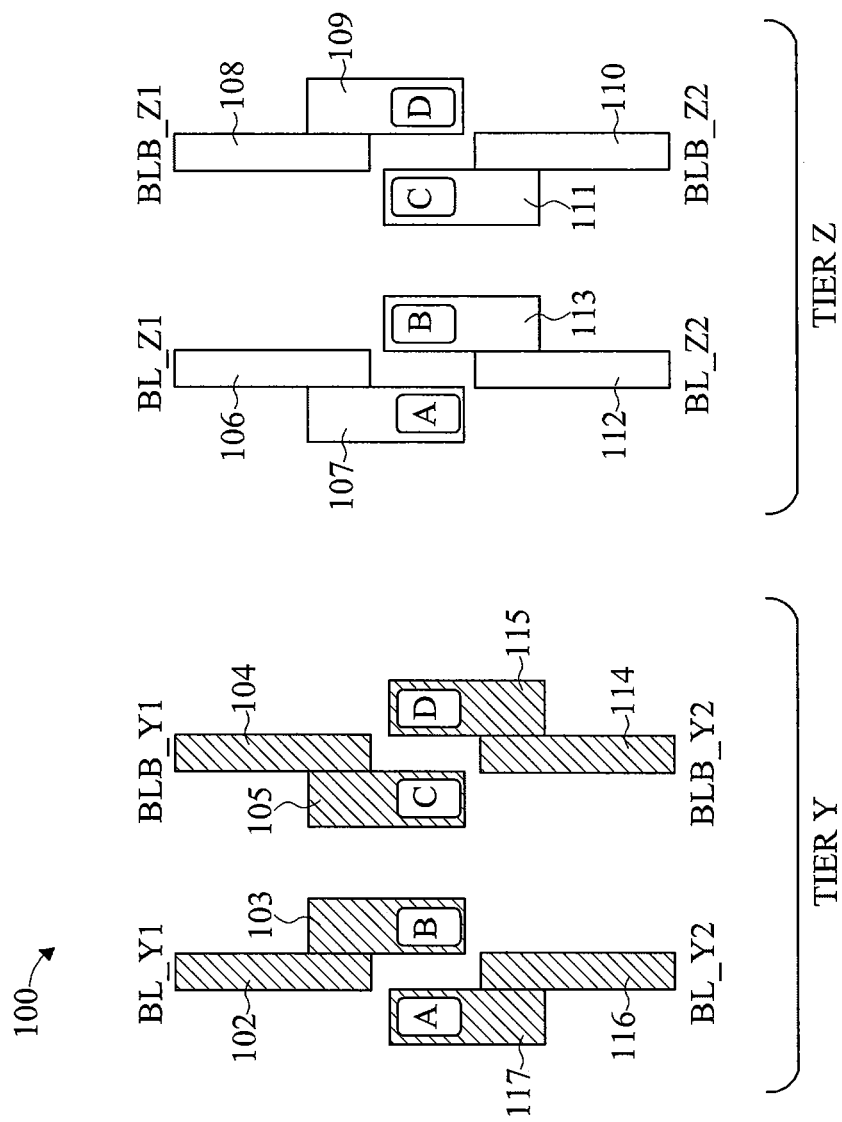
FIG. 2B is a top plan view of a 3D bit line layout in accordance with some embodiments of the present disclosure.

FIG. 2B is a top plan view of a 3D bit line layout 100 in accordance with some embodiments of the present disclosure. FIG. 2B illustrates one implementation of the 3D bit line layout 100 described above with reference to FIG. 2A, although alternative layouts can be used.

The embodiment illustrated in FIG. 2B implements the 3D bit line layout 100 of FIG. 2A through horizontally-offset bit lines. Horizontally-offset bit lines comprise a first part disposed along a first axis and a second part which is connected to the first part and horizontally (i.e., in the plane of the substrate) offset from the first axis. These first parts and second parts are then connected by vertical bit lines to connect the various segments 10-A to 10-D as described above with reference to FIG. 2A.

More specifically, first bit line BL-Y1 comprises first part 102 and second part 103, where second part 103 is horizontally offset from, but overlapping and connected to, first part 102. Second bit line BLB-Y1 comprises first part 104 and second part 105. First bit line BL-Z1 comprises first part 106 and second part 107. Second bit line BLB-Z1 comprises first part 108 and second part 109. First bit line BL-Z2 comprises first part 112 and second part 113. Second bit line BLB-Z2 comprises first part 110 and second part 111. First bit line BL-Y2 comprises first part 116 and second part 117. Second bit line BLB-Y2 comprises first part 114 and second part 115.

Vertical bit lines A, B, C, and D connect respective pairs of the second parts 103, 105, 107, 109, 111, 113, 115, and 117 to form inter-tier memory cell columns. That is, vertical bit line A connects second part 107 with second part 117. Vertical bit line B connects second part 103 with second part 113. Vertical bit line C connects second part 105 with second part 111. Vertical bit line D connects second part 109 with second part 115.

As a result of the above-described connections, first segment 10-A and fourth segment 10-D form a first inter-tier memory cell column. Second segment 10-B and third segment 10-C form a second inter-tier memory cell column.

Figure 2C:
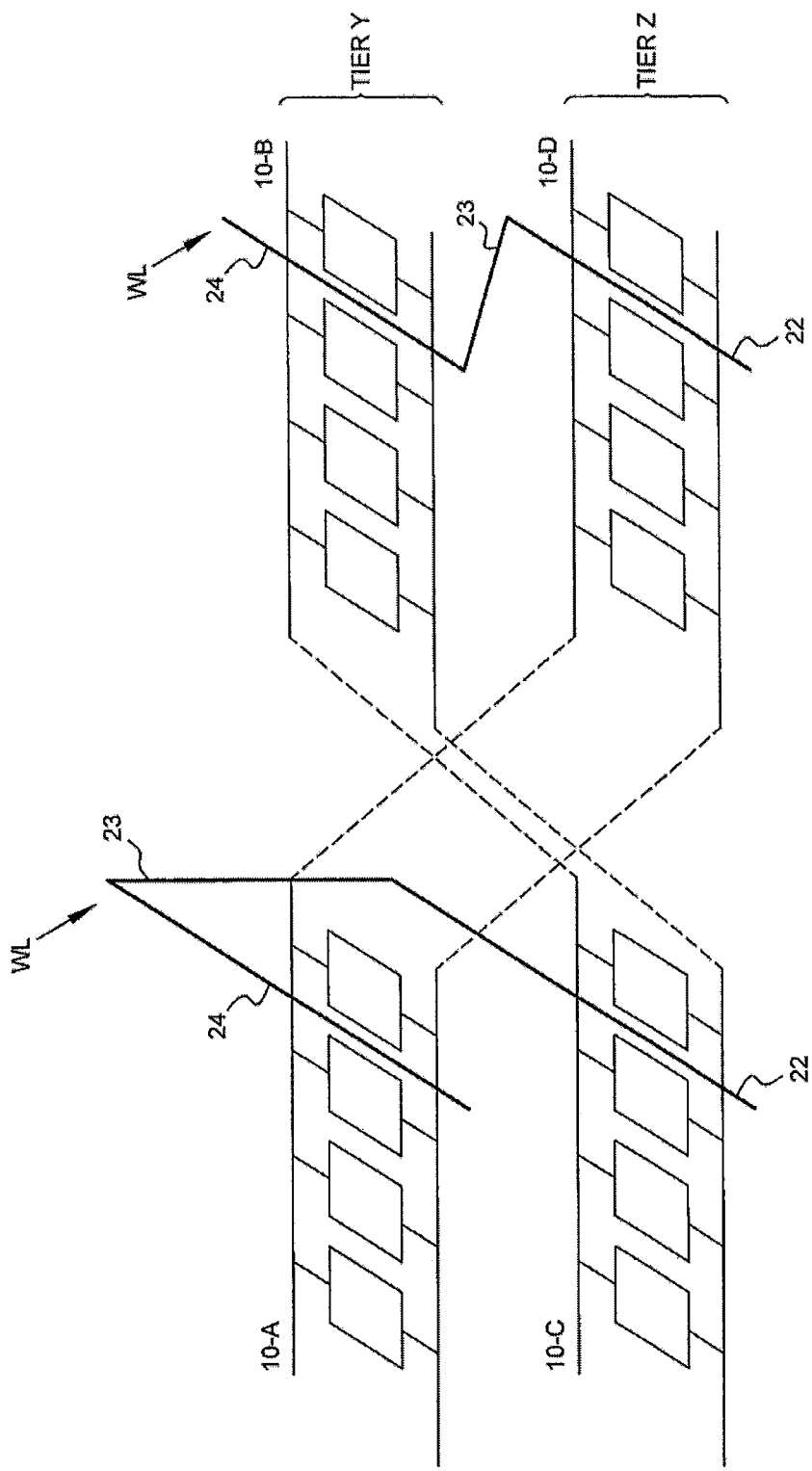
FIG. 2C is a schematic view of a 3D bit line layout with an inter-tier word line in accordance with some embodiments of the present disclosure.

FIG. 2C is a schematic view of a 3D bit line layout 100 with an inter-tier word line WL in accordance with some embodiments of the present disclosure. In some embodiments, an inter-tier word line WL is connected between Tier Y and Tier Z. Inter-tier word line WL comprises a first horizontal section 22 and second horizontal section 24 connected by vertical section 23. In some embodiments, vertical section 23 traverses the width of a segment as shown in the inter-tier word line WL connecting second segment 10-B and fourth segment 10-D.

Figure 3A:
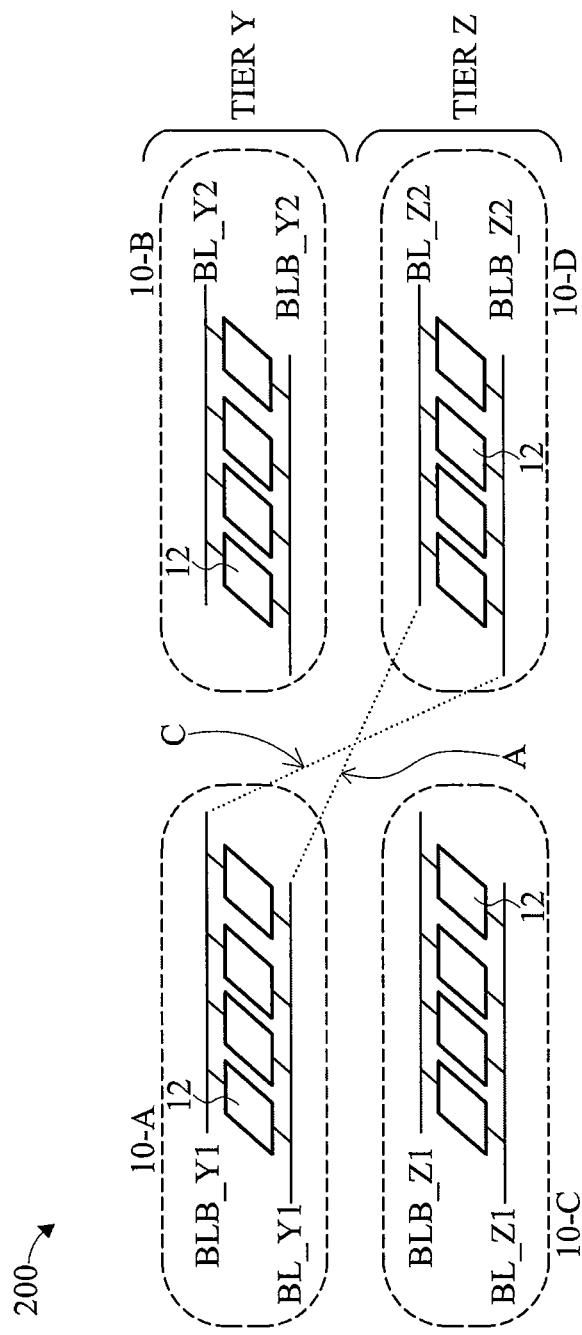
FIG. 3A is a schematic view of a partially-connected 3D bit line layout in accordance with some embodiments of the present disclosure.
Figure 3B:
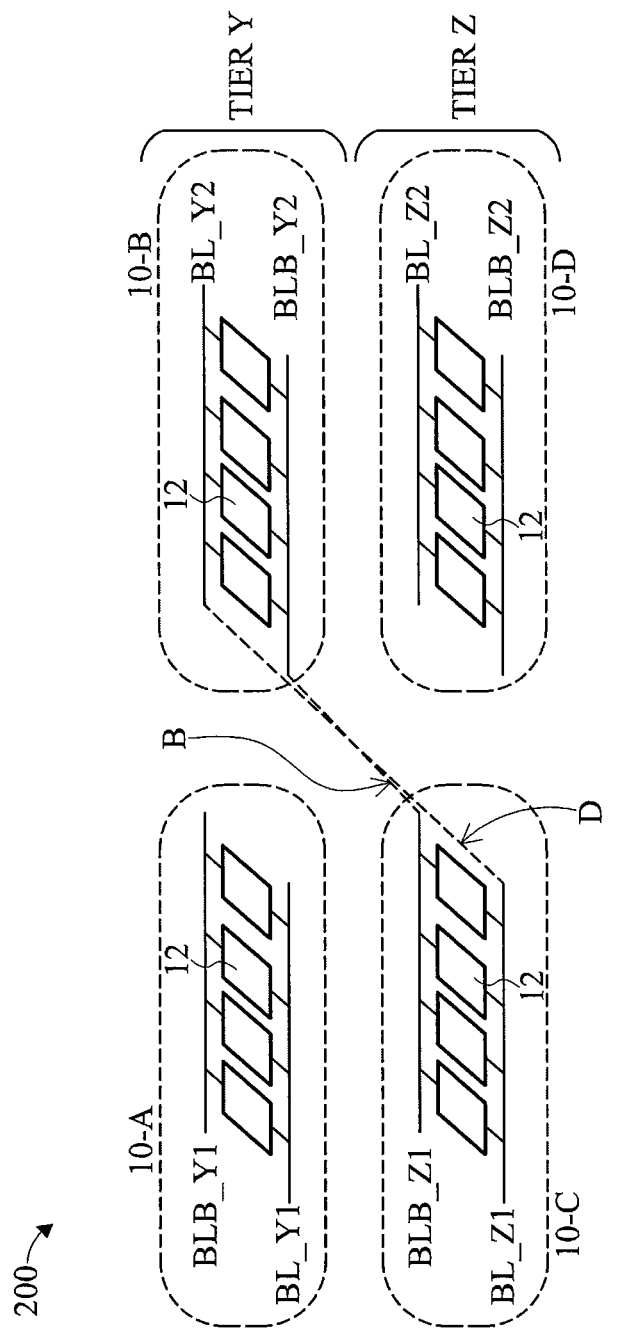
FIG. 3B is a schematic view of a partially-connected 3D bit line layout in accordance with some embodiments of the present disclosure.

FIG. 3A is a schematic view of a partially-connected 3D bit line layout 200 in accordance with some embodiments of the present disclosure. FIG. 3B is a schematic view of a partially-connected 3D bit line layout 200 in accordance with the embodiment of FIG. 3A. For ease of viewing each of the FIGS. 3A and 3B only shows a respective subset of the connections.

The 3D bit line layout 200 illustrated in FIGS. 3A and 3B is similar to the 3D bit line layout 100 illustrated in FIG. 2A, except as described below. Four segments (10-A, 10-B, 10-C, and 10-D) are arranged in two tiers (Y and Z). Each segment 10 comprises a first bit line, second bit line, and a plurality of cells 12 disposed between and connected to the first and second bit lines.

The 3D bit line layout 200 illustrated in FIGS. 3A and 3B and the 3D bit line layout 100 illustrated in FIG. 2A differ in the location of first bit lines BL-Y2 and BL-Z2 and second bit lines BLB-Y2 and BLB-Z2. In the 3D bit line layout 200 of FIGS. 3A and 3B, these bit lines are located on opposite sides from the 3D bit line layout 100. Put differently, first bit lines are no longer all disposed within a first plane and second bit lines are no longer all disposed in a second plane.

The result of the new locations for these first bit lines and second bit lines is that vertical bit lines A, B, C, and D now connect segments 10-A to 10-D to create a "twisted inter-tier memory cell column.". For the purposes of this disclosure, the term "twisted" indicates that a bit line of the memory cell column is located on a first side of the memory cell column in a first tier and on a second side of the memory cell column in a second tier.

FIG. 3A illustrates the connection of first segment 10-A to fourth segment 10-D. Vertical bit line A connects first bit line BL-Y1, disposed on a first side of the memory cell column, to first bit line BL-Z2, disposed on a second side of the memory cell column. Vertical bit line C connects second bit line BLB-Y1, disposed on the second side of the memory cell column, to second bit line BLB-Z2, disposed on the first side of the memory cell column. As a result of the connections made by vertical bit lines A and C, first segment 10-A and fourth segment 10-D form a twisted inter-tier memory cell column.

FIG. 3B illustrates the connection of second segment 10-B to third segment 10-C. Vertical bit line D connects first bit line BL-Z1, disposed on the first side, to first bit line BL-Y2, disposed on the second side. Vertical bit line B connects second bit line BLB-Z1, disposed on the second side, to second bit line BLB-Y2, disposed on the first side. As a result of the connections made by vertical bit lines B and D, second segment 10-B and third segment 10-C form a twisted inter-tier memory cell column.

Figure 3C:
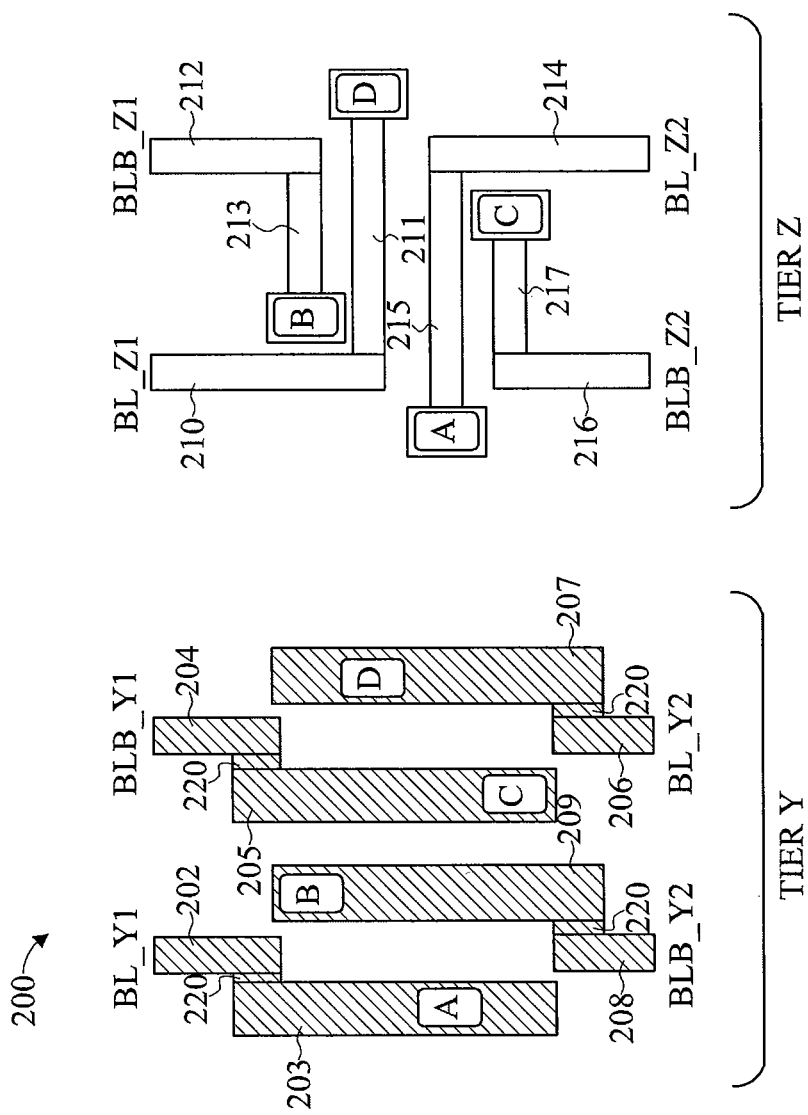
FIG. 3C is a top plan view of a 3D bit line layout in accordance with some embodiments of the present disclosure.

FIG. 3C is a top plan view of a 3D bit line layout 200 in accordance with some embodiments of the present disclosure. FIG. 3C illustrates one implementation of the 3D bit line layout 200 described above with reference to FIGS. 3A and 3B, although alternative layouts can be used.

The embodiment illustrated in FIG. 3C implements the 3D bit line layout 200 of FIGS. 3A and 3B through a combination of horizontally-offset bit lines, perpendicular bit lines, and vertical bit lines.

Horizontally-offset bit lines comprise a first part disposed along a first axis and a second part which is connected to the first part and horizontally offset from the first axis. More specifically, first bit line BL-Y1 comprises first part 202 and second part 203, where second part 203 is horizontally offset from, but overlapping and connected to, first part 202. Second bit line BLB-Y1 comprises first part 204 and second part 205, where second part 205 is horizontally offset from, but overlapping and connected to, first part 204. First bit line BL-Y2 comprises first part 206 and second part 207, where second part 207 is horizontally offset from, but overlapping and connected to, first part 206. Second bit line BLB-Y2 comprises first part 208 and second part 209, where second part 209 is horizontally offset from, but overlapping and connected to, first part 208. In some embodiments, a horizontal extender 220 is disposed between each first part (202, 204, 206, 208) and each respective second part (203, 205, 207, 209).

Perpendicular bit lines comprise a first part disposed along a first axis and a second part connected to the first part and disposed perpendicular to the first axis. More specifically, first bit line BL-Z1 comprises first part 210 and second part 211. Second bit line BLB-Z1 comprises first part 212 and second part 213. First bit line BL-Z2 comprises first part 214 and second part 215. Second bit line BLB-Z2 comprises first part 216 and second part 217.

Vertical bit lines A, B, C, and D connect the various segments 10 as described above with reference to FIGS. 3A and 3B.

Figure 3D:
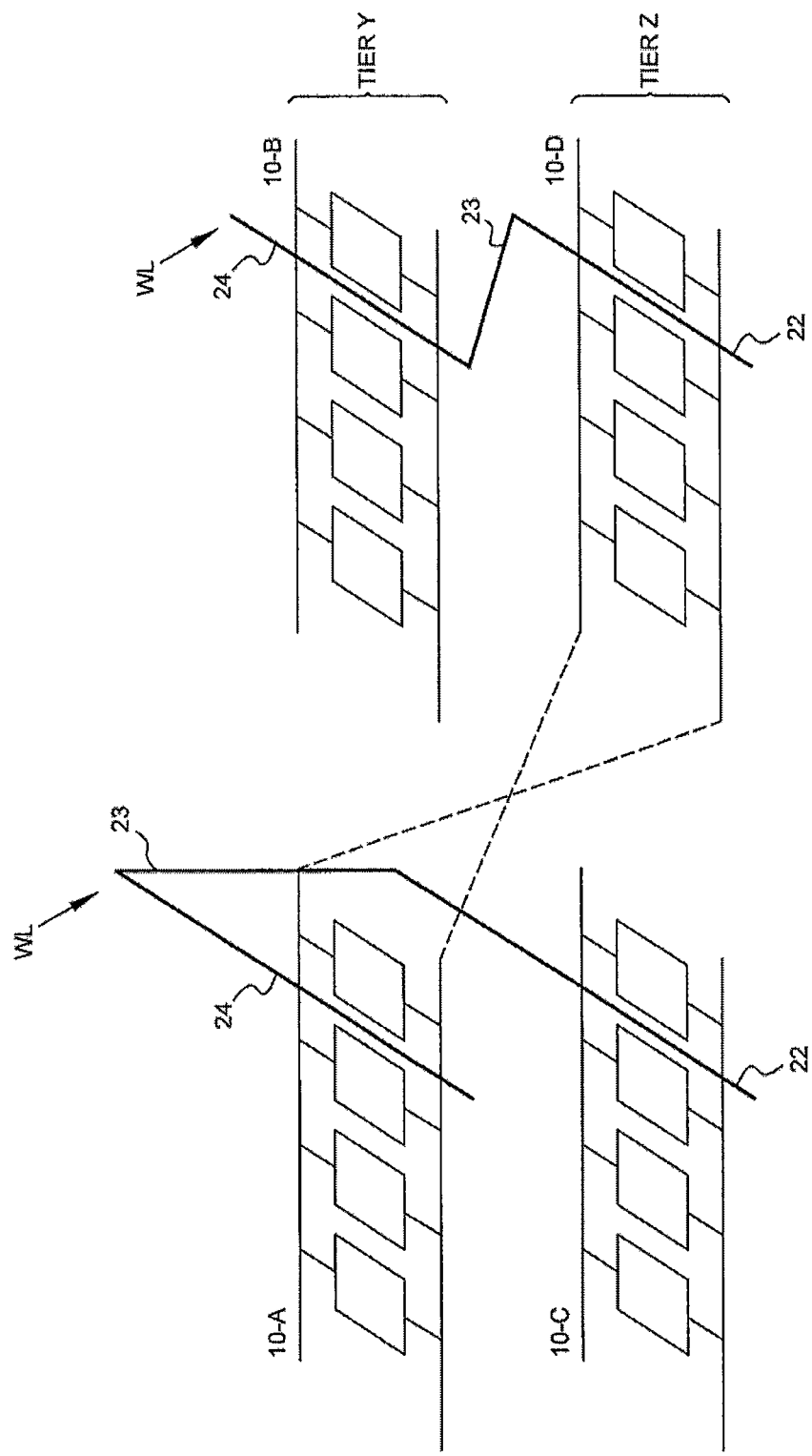
FIG. 3D is a schematic view of a partially-connected 3D bit line layout with an inter-tier word line in accordance with some embodiments of the present disclosure.

FIG. 3D is a schematic view of a partially-connected 3D bit line layout 200 with an inter-tier word line WL in accordance with some embodiments of the present disclosure. In some embodiments, an inter-tier word line WL is connected between Tier Y and Tier Z. Inter-tier word line WL comprises a first horizontal section 22 and second horizontal section 24 connected by vertical section 23. In some embodiments, vertical section 23 traverses the width of a segment as shown in the inter-tier word line WL connecting second segment 10-B and fourth segment 10-D.

In some embodiments of the present disclosure, a sense amplifier is disposed at the end of each inter-tier memory cell column.

Although the embodiments discussed herein relate to two-tiered structures, the present disclosure can be further applied to multiple-tiered structures such that a bit line connects a memory column extending across three or more tiers.

Figure 4:
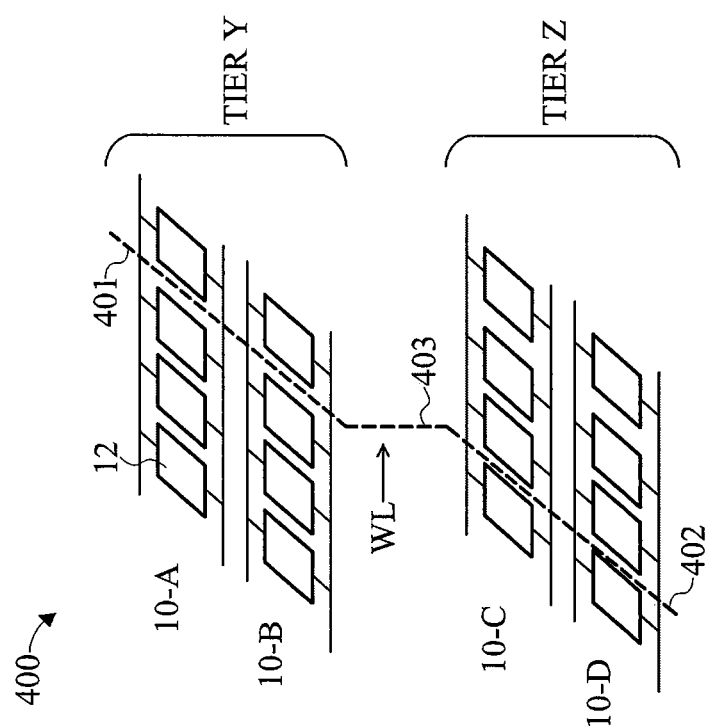
FIG. 4 is a schematic view of a 3D word line layout in accordance with some embodiments of the present disclosure.

FIG. 4 is a schematic view of a 3D word line layout 400 in accordance with some embodiments of the present disclosure. FIG. 4 presents four segments 10 of memory cell columns: a first segment 10-A, a second segment 10-B, a third segment 10-C, and a fourth segment 10-D. The four segments 10 are arranged into two tiers—Tier Y and Tier Z—of a 3D IC, with first segment 10-A and second segment 10-B disposed in Tier Y and third segment 10-C and fourth segment 10-D disposed in Tier Z. Each segment comprises a pair of bit lines and a plurality of memory cells 12 disposed between and connected to the bit lines.

A multi-tier word line WL comprises first horizontal portion 401, second horizontal portion 402, and vertical portion 403. First horizontal portion 401 is disposed generally perpendicular to the bit lines of, and connected across, first segment 10-A and second segment 10-B. Second horizontal portion 402 is disposed generally perpendicular to the bit lines of, and connected across, third segment 10-C and fourth segment 10-D. Vertical portion 403 connects first horizontal portion 401 and second horizontal portion 402.

Figure 5:
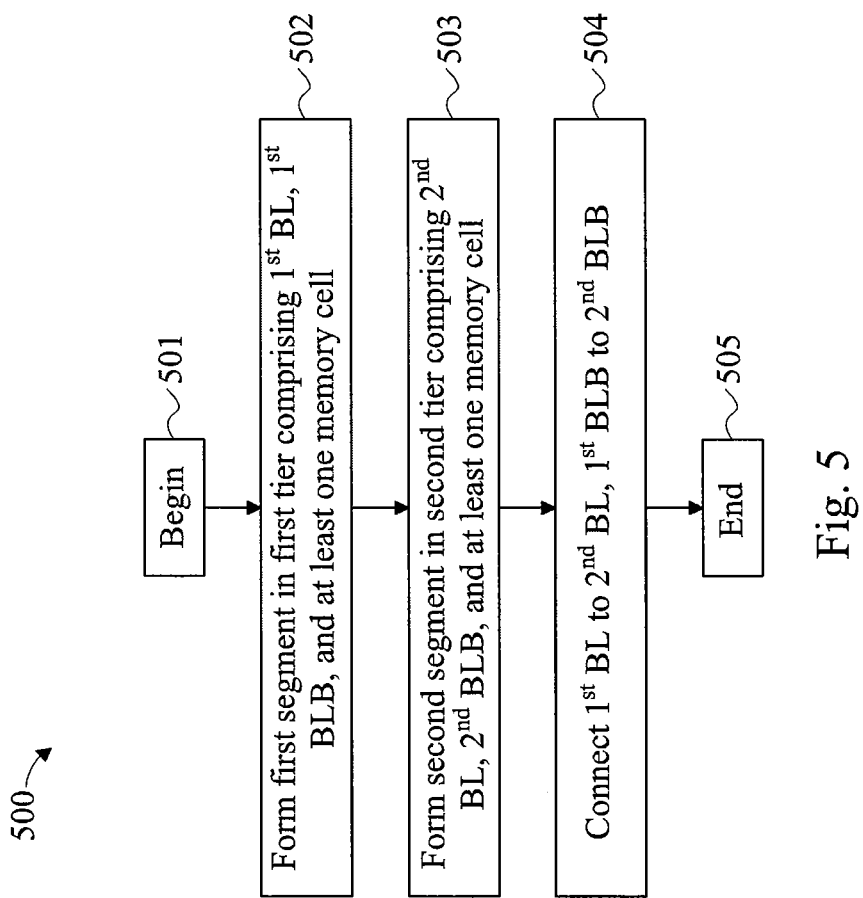
FIG. 5 is a flow diagram of a method in accordance with some embodiments of the present disclosure.

A method of forming an inter-tier memory column is further disclosed in accordance with some embodiments. FIG. 5 is a flow diagram of one example of a method in accordance with some embodiments. Process 500 begins at block 501. At block 502 a first segment is formed in a first tier comprising a first bit line, a first bit line bar, and at least one memory cell. At block 503 a second segment is formed in a second tier comprising a second bit line, a second bit line bar, and at least one memory cell. At block 504 the first bit line is connected to the second bit line and the first bit line bar is connected to the second bit line bar to form an inter-tier memory cell column. The process ends at block 505.

Figure 6:
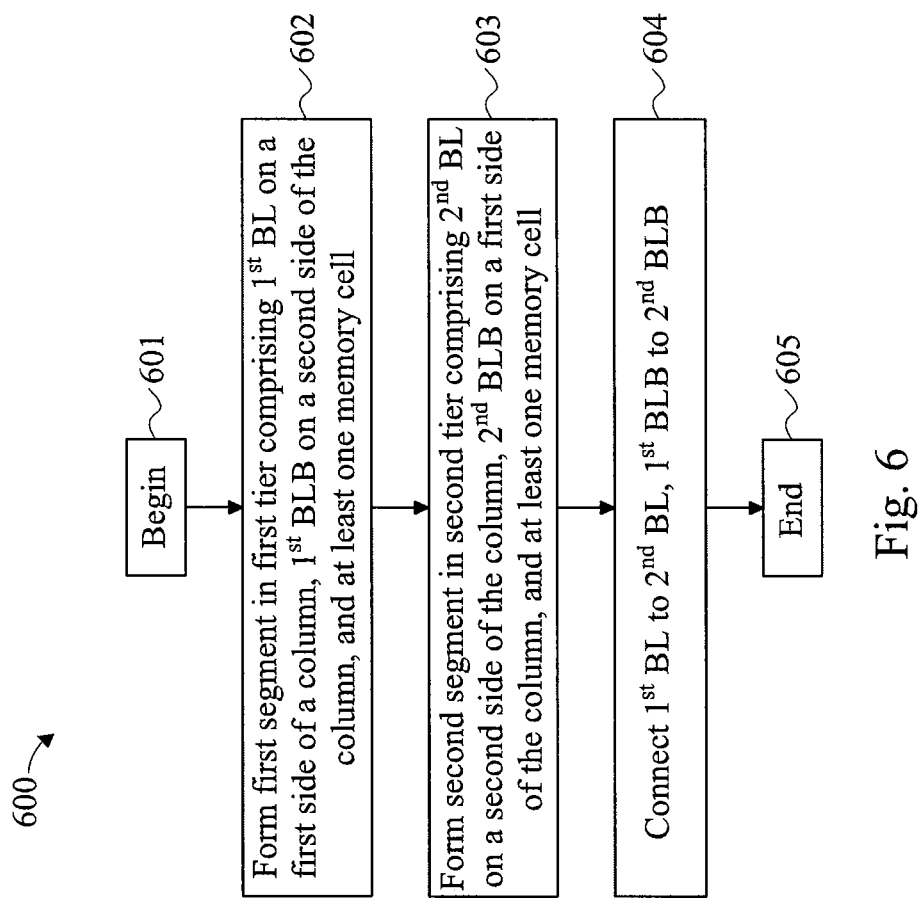
FIG. 6 is a flow diagram of a method in accordance with some embodiments of the present disclosure.

A further method is provided for forming an inter-tier memory column in accordance with some embodiments. FIG. 6 is a flow diagram of one example of a method in accordance with some embodiments. Process 600 begins at block 601. At block 602 a first segment is formed in a first tier comprising a first bit line on a first side of a column, a first bit line bar on a second side of the column, and at least one memory cell. At block 603 a second segment is formed in a second tier comprising a second bit line on a second side of the column, a second bit line bar on a first side of the column, and at least one memory cell. At block 604 the first bit line is connected to the second bit line and the first bit line bar is connected to the second bit line bar to form an inter-tier memory cell column. The process ends at block 605.

Figure 7:
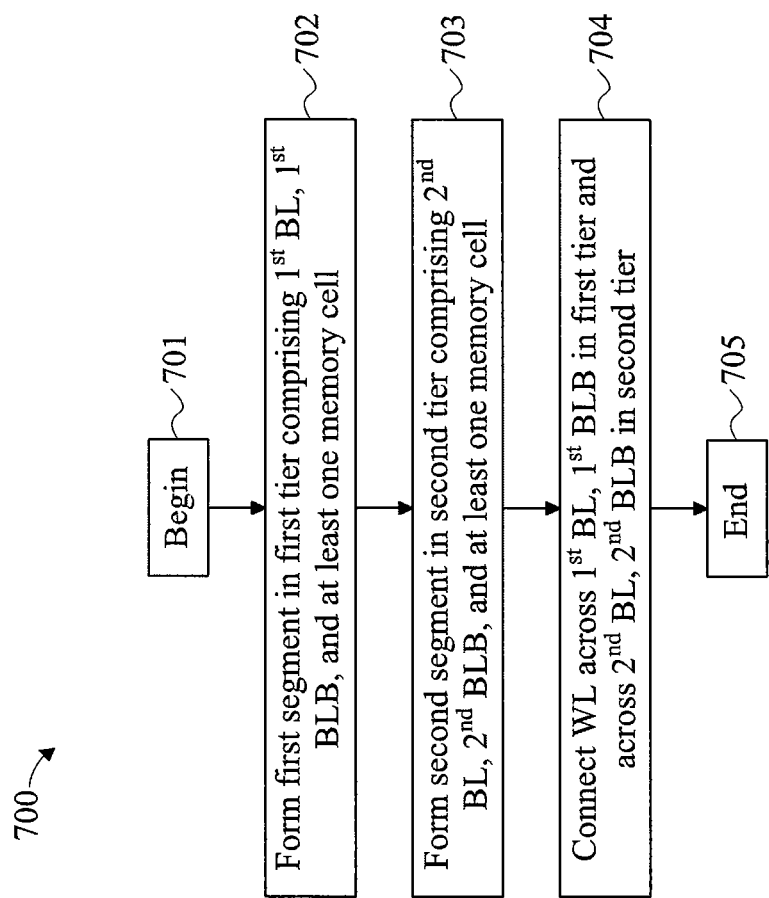
FIG. 7 is a flow diagram of a method in accordance with some embodiments of the present disclosure.

A further method is provided for forming an inter-tier word line in accordance with some embodiments. FIG. 7 is a flow diagram of one example of a method in accordance with some embodiments. Process 700 begins at block 701. At block 702 a first segment is formed in a first tier comprising a first bit line, a first bit line bar, and at least one memory cell. At block 703 a second segment is formed in a second tier comprising a second bit line, a second bit line bar, and at least one memory cell. At block 704 a word line is connected across the first bit line and the first bit line bar and also across the second bit line and the second bit line bar to form an inter-tier word line. The process ends at block 705.

The 3D conductive line layouts described above include several advantages. For example, by distributing the memory cell column between at least two tiers, the process variation of different tiers in a 3D memory circuit can be averaged, resulting in a 3D memory circuit that is no longer limited in performance by its weakest tier. The above embodiments balance process variation and loading of a memory cell column by distributing the column between at least two tiers and, in some embodiments, changing the side of the column such that the bit lines occupy different sides of the column in different tiers. Thus the above embodiments provide improved design margins and better performance of 3D memory circuits.

In some embodiments an inter-tier memory column comprises a first segment disposed within a first tier of a three-dimensional integrated circuit (3D IC), the first segment comprising a first bit line, a first bit line bar, and a first plurality of memory cells, the first plurality of memory cells disposed between and connected to the first bit line and the first bit line bar; a second segment disposed within a second tier of the 3D IC, comprising a second bit line, a second bit line bar, and a second plurality of memory cells, the second plurality of memory cells disposed between and connected to the second bit line and the second bit line bar; and wherein the first bit line is connected to the second bit line, and the first bit line bar is connected to the second bit line bar.

In some embodiments a three-dimensional integrated circuit (3D IC) comprises a first memory cell segment and a second memory cell segment, disposed within a first tier of the 3D IC; a third memory cell segment and a fourth memory cell segment, disposed within a second tier of the 3D IC; wherein the first memory cell segment is connected with the third memory cell segment and the second memory cell segment is connected with the fourth memory cell segment; and wherein each memory cell segment comprises a first bitline, a second bitline, and at least one memory cell disposed between and connected to the first bitline and the second bitline.

In some embodiments a method of forming an inter-tier memory column comprises forming a first segment in a first tier of a three-dimensional integrated circuit (3D IC), the first segment comprising a first bit line, a first bit line bar, and a plurality of memory cells, the plurality of memory cells disposed between and connected to the first bit line and the first bit line bar forming a second segment disposed within a second tier of the 3D IC, the second segment comprising a second bit line, a second bit line bar, and a plurality of memory cells, the plurality of memory cells disposed between and connected to the second bit line and the second bit line bar; connecting the first bit line and the second bit line; and connecting and the first bit line bar and the second bit line bar.

Although examples are illustrated and described herein, embodiments are nevertheless not limited to the details shown, since various modifications and structural changes may be made therein by those of ordinary skill within the scope and range of equivalents of the claims.

What is claimed is:

1. An inter-tier memory column, comprising:
   a first bit line, comprising:
      a first segment disposed within a first tier of a three-dimensional integrated circuit (3D IC)
      a second segment disposed within a second tier of said 3D IC disposed along a second axis horizontally offset from a first axis,
      wherein said first segment is electrically connected to said second segment by a first conductive member extending continuously from said first segment to said second segment; and
   a second bit line comprising:
      a third segment disposed within said first tier of said 3D IC along a third axis parallel to said second axis; and
      a fourth segment disposed within said second tier of said 3D IC along a fourth axis parallel to said first axis, wherein said third segment is electrically connected to said fourth segment by a second conductive member extending continuously from said third segment to said fourth segment.

2. The inter-tier memory column of claim 1, wherein said first axis and said second axis are parallel.

3. The inter-tier memory column of claim 1, further comprising an inter-tier word line connected across said first segment and said second segment.

4. The inter-tier memory column of claim 1, comprising:
   a first bit line bar comprising:
      a first bar segment disposed within said first tier of said 3D IC; and
      a second bar segment horizontally offset from said first bar segment.

5. The inter-tier memory column of claim 4, comprising:
   a second bit line bar comprising:
      a third bar segment disposed within said second tier of said 3D IC; and
      a fourth bar segment perpendicular to said third bar segment,
   wherein said horizontally offset second bar segment and said perpendicular fourth bar segment are connected by a vertical bit line.

6. The inter-tier memory column of claim 1, further comprising:
   a third bit line comprising a fifth segment disposed in said first tier of said 3D IC along a fifth axis and a sixth segment connected to said fifth segment and horizontally offset from said fifth axis; and
   a fourth bit line comprising a seventh segment disposed in said second tier of said 3D IC along a seventh axis and an eighth segment connected to said seventh segment and disposed perpendicular to said seventh axis.

7. The inter-tier memory column of claim 6, wherein said third bit line is electrically connected to said fourth bit line by a conductive member extending continuously from said third bit line to said fourth bit line.

8. The inter-tier memory column of claim 1, comprising a first conductive extender coupling said first segment to said second segment.

9. The inter-tier memory column of claim 8, wherein said first coupling extender is disposed perpendicular to said first axis.

10. An inter-tier memory column, comprising:
    a first bit line, comprising:
       a first segment disposed within a first tier of a three-dimensional integrated circuit (3D IC)
       a second segment disposed within a second tier of said 3D IC disposed along a second axis horizontally offset from a first axis;
    a first plurality of memory cells electrically connected to said first bit line;
    a second bit line comprising:
       a third segment disposed within said first tier of said 3D IC along a third axis parallel to said second axis; and
       a fourth segment disposed within said second tier of said 3D IC along a fourth axis parallel to said first axis; and
    a second plurality of memory cells electrically connected to said second bit line;
    wherein said first segment is electrically connected to said second segment by a first conductive member extending continuously from said first segment to said second segment, and wherein said third segment is electrically connected to said fourth segment by a second conductive member extending continuously from said third segment to said fourth segment.

11. The inter-tier memory column of claim 10, wherein said first axis and said second axis are parallel.

12. The inter-tier memory column of claim 10, further comprising an inter-tier word line connected across said first segment and said second segment.

13. The inter-tier memory column of claim 10, comprising:
- a first bit line bar comprising:
  - a first bar segment disposed within said first tier of said 3D IC; and
  - a second bar segment horizontally offset from said first bar segment; and
- a second bit line bar comprising:
  - a third bar segment disposed within said second tier of said 3D IC; and
  - a fourth bar segment perpendicular to said third bar segment,
- wherein said horizontally offset second bar segment and said perpendicular fourth bar segment are connected by a vertical bit line.

14. The inter-tier memory column of claim 10, further comprising:
- a third bit line comprising a fifth segment disposed in said first tier of said 3D IC along a fifth axis and a sixth segment connected to said fifth segment and horizontally offset from said fifth axis; and
- a fourth bit line comprising a seventh segment disposed in said second tier of said 3D IC along a seventh axis and an eighth segment connected to said seventh segment and disposed perpendicular to said seventh axis.

15. The inter-tier memory column of claim 14, wherein said third bit line is electrically connected to said fourth bit line by a conductive member extending continuously from said third bit line to said fourth bit line.

16. The inter-tier memory column of claim 10, comprising a first conductive extender coupling said first segment to said second segment, wherein said first coupling extender is disposed perpendicular to said first axis.

17. A method of forming an inter-tier memory column, comprising:
- forming a first bit line comprising a first segment disposed within a first tier of a three-dimensional integrated circuit (3D IC) and a second segment disposed within a second tier of said 3D IC disposed along a second axis horizontally offset from a first axis;
- forming a second bit line comprising a third segment disposed within said first tier of said 3D IC along a third axis parallel to said second axis and a fourth segment disposed within said second tier of said 3D IC along a fourth axis parallel to said first axis; and
- connecting said first segment to said second segment with a first vertical conductive element.

18. The method of claim 17, wherein said first vertical conductive element extends continuously from said first segment to said second segment.

19. The method of claim 17 further comprising:
- forming a first bit line bar comprising a first bar segment disposed within said first tier of said 3D IC and a second bar segment horizontally offset from said first bar segment;
- forming a second bit line bar comprising a third bar segment disposed within said second tier of said 3D IC and a fourth bar segment perpendicular to said third bar segment; and
- connecting said first bit line bar to said second bit line bar with a second vertical conductive element.

20. The method of claim 17, further comprising forming an inter-tier word line which connects the first bit line and the second bit line.

* * * * *